Dec. 21, 1965 J. V. J. CORNEY 3,225,217

MONOSTABLE PULSE GENERATOR WITH CHARGE STORGE PREVENTION MEANS

Filed Nov. 26, 1962

INVENTOR
JOHN VICTOR JAMES CORNEY

United States Patent Office 3,225,217

Patented Dec. 21, 1965

3,225,217

MONOSTABLE PULSE GENERATOR WITH CHARGE STORAGE PREVENTION MEANS

John Victor James Corney, London, England, assignor to Ferguson Radio Corporation Limited, London, England Filed Nov. 26, 1962, Ser. No. 240,115
2 Claims. (Cl. 307—88.5)

The present invention relates to pulse generators of the type comprising a transistor which is, in use, normally in a heavily conductive state but which is driven into a cut off state by a transition (either negative-going or positive-going) of the input waveform applied to the input electrode of the transistor through a capacitor and returns to the heavily conductive state after an interval determined by a time constant of the circuit.

An output pulse of amplitude determined by the potentials applied to the transistor, of duration determined by the said time constant and time of occurrence determined by the input waveform is thus provided. Ideally the duration should be unaffected by variations in the operating potentials and, to take the case where negative-going transitions in the input waveform initiate the pulses, the intervening positive-going transitions should have no effect on the output waveform obtained.

It is an object of the present invention to provide a pulse generator of the type specified meeting all these requirements reliably and conveniently. Before describing the invention, however, it will be convenient to consider some known or proposed circuits and see the difficulties which have to be overcome. These difficulties and the solution thereof provided by the present invention will be readily understood from the following description when viewed in conjunction with the accompanying drawings in which.

Figure 1:
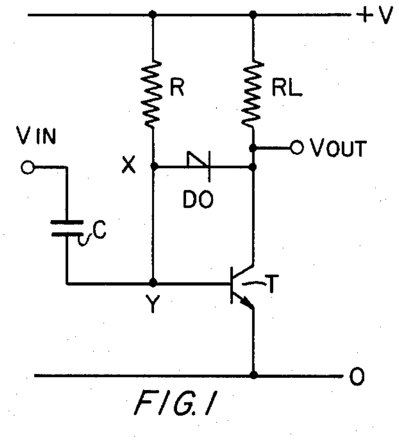
FIG. 1 is a circuit diagram of a first type of pulse generator.

In FIG. 1 an n-p-n transistor T is connected in grounded emitter configuration with collector load RL and bias to the base through resistor R. The input V IN to the base is applied through capacitor C and the output V OUT is taken from the collector. A diode D*o* provides current feedback from the collector to the base.

Figure 3:
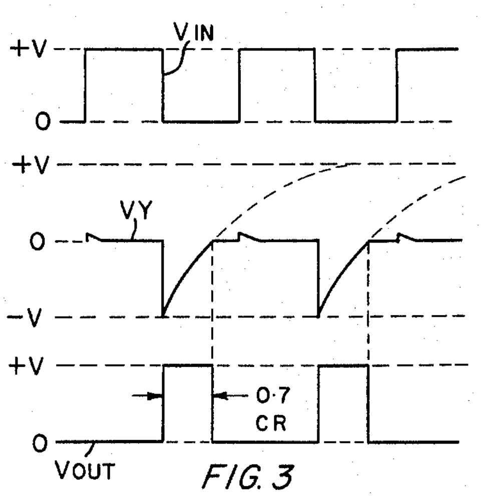
FIG. 3 shows the waveforms associated with the circuit of FIG. 1.

The mode of operation of this circuit is indicated in FIG. 3. The negative-going transitions in V IN take the transistor from a heavily conductive, almost bottomed state in which V OUT is substantially at emitter potential (0 volts) to a cut off state in which V OUT rises substantially to +V, the potential applied to the resistor RL. As charge leaks from the capacitor C with time constant CR, the potential VY on the base of the transistor rises from the negative value to which it was depressed by the negative-going edge of V IN to its quiescent value of 0 volts when the transistor turns on again and V OUT falls to 0 volts. The width of each output pulse is approximately 0.7 CR. As shown in FIG. 3, the amplitude of V IN is made equal to +V and the width 0.7 CR is substantially independent of variations in +V. The positive-going edges of V IN have substantially no effect on V OUT.

This simple circuit suffers from some disadvantages. Carrier storage and variations in $\beta$ between transistors limit the minimum pulse-width reproducible with a given transistor type. Thus the base-feed resistor R is chosen such that a transistor of minimum $\beta$ would just be bottomed in the absence of diode D*o*. A high-$\beta$ transistor would, in the absence of diode D*o*, be bottomed severely. Over-bottoming increases the excess stored base charge and increases turn-off delay, reducing the output pulse-width by delaying the leading edge of the output pulse. If furthermore, in the absence of D*o*, capacitor C is chosen to give an output pulse of minimal duration using a transistor of low $\beta$, a transistor of substantially higher $\beta$ would store such excess base charge when bottomed, that it could not be turned off by the chosen capacitor C. The high-$\beta$ transistor would thus give no output pulse.

The diode D*o* is a means of applying current feedback between the collector and base of the transistor in the quiescent state, so reducing dependence of the stored base charge and the output pulse width on $\beta$.

Figure 2:
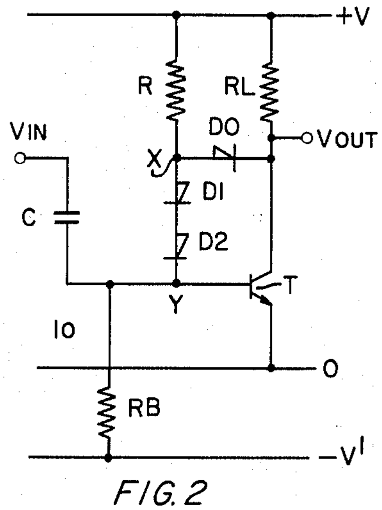
FIG. 2 is a circuit diagram of a second type of pulse generator.

The action of this feedback may be improved by known means. Thus a resistor of value small relative to R may be inserted in the lead between X and Y; since the quiescent potential at X is now greater than that at Y the quiescent potential of the transistor collector is increased and the degree of bottoming of a given transistor is reduced. One or more forward-conducting diodes, $D_1$, $D_2$ may be inserted, instead of a low resistor, between X and Y as shown in FIG. 2. By virtue of the non-linear forward impedance of these diodes the feedback transfer from X to Y can be increased in this way for a given potential difference between X and Y. Again, the forward impedance of these diodes may be reduced by bleeding through them a constant current $I_o$ less than the quiescent current in the resistor R by an amount such that a transistor of minimum $\beta$ would bottom in the absence of D*o*. To this end the point Y is returned to a potential $-V^1$ through a resistor RB in FIG. 2.

Figure 4:
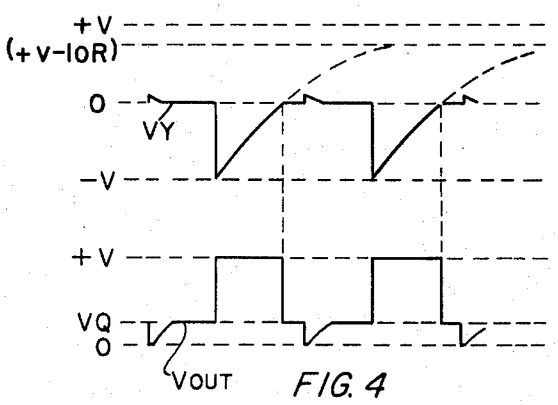
FIG. 4 shows the waveform associated with the circuit of FIG. 2.

If these methods are applied, the performance deteriorates in other respects. Because the quiescent potential of the transistor is raised by the introduction of the diodes $D_1$, $D_2$, the device becomes responsive to the on-driving positive-going edges of the input waveform. Despite the feedback the transistor can be driven from its quiescent collector potential $+V_Q$ into the bottomed state by these input edges, as shown in FIG. 4. This distortion of the output pulse may be unacceptable. Furthermore the potential at Y runs exponentially to an asymptotic value $(+V-I_oR)$ instead of toward +V, so that unless resistor R is returned to a new potential $(+V+I_oR)$ the pulse-width varies with supply potential +V.

According to the present invention, in a circuit of the type specified, current feedback from the output electrode of the transistor to the input electrode is provided by way of a diode so as to limit bottoming of the transistor, the feedback path including one or more further diodes poled oppositely to the first so as always to maintain a potential difference between the input and output electrodes opposed to bottoming of the transistor, and the capacitor is connected to the input electrode and a source of potential through two further diodes respectively so poled that only negative-going or positive-going transitions, as the case may be, can be applied to the input electrode of the transistor.

The use of a pair of diodes to allow transitions in one sense only to be applied to a given point in a circuit is of course well known in itself. There are special advantages in using the same in a circuit according to the invention as will be apparent from the following description by way of example of one embodiment of the invention, illustrated in FIG. 5 of the accompanying drawings.

Figure 5:
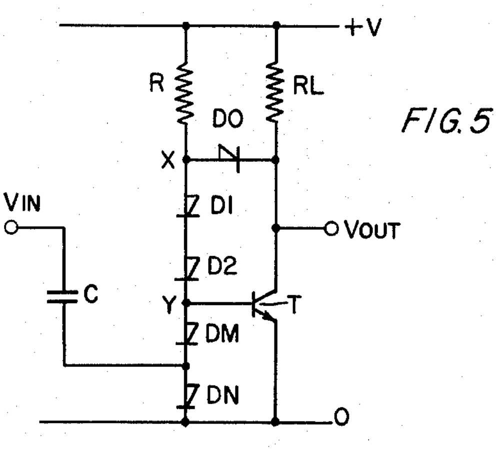
FIG. 5 is a circuit diagram of a pulse generator constructed in accordance with the present invention.

A comparison between FIG. 2 and FIG. 5 will show that the diodes $D_1$ and $D_2$ are retained but the resistor RB is omitted. Moreover, the capacitor C is no longer connected direct to the base of the transistor (point Y) but is connected to the junction of diodes D*m* and D*n*. These diodes are connected between Y and 0 volts and ensure that the positive-going edges of the V IN are without effect on the potential at Y.

Thus input transitions which reverse-bias D*n* render D*m* conductive, connecting capacitor C to the transistor base. Input transitions which forward-bias D*n* reverse-bias D*m* so that the transistor does not respond to these transitions. The quiescent base-to-emitter potential difference of the transistor is not zero even if the transistor $\beta$ is infinite, so that diodes D*m* and D*n* are forward-biased in the quiescent state and produce a corresponding potential drop across diodes $D_1$, $D_2$. Hence these remain effective even if the transistor $\beta$ is infinite. During the active period of pulse generation, however, since D*n* is now reverse biased, this "bleed" current ceases and does not modify the asymptotic limit of the exponential run-back of the potential at Y. A most undesirable feature of FIG. 2 is thus avoided. Provided the potential at X is small relative to the supply potential the pulse width is not dependent on supply potential so long as the input signal amplitude is in constant proportion to this supply potential. The minimum pulse-width practicable with this circuit despite variations in $\beta$ between transistors of a given type is in practice one half or less of that practicable with the same type of transistor in the basic circuit of FIG. 1.

The NPN transistors shown in the FIGURE 5 are, of course, not essentially such; PNP transistors may be used with suitable inversion of supply polarities and reversal of diodes.

I claim:

1. In a pulse generator comprising a transistor having an input and an output electrode, means for biasing said transistor normally to a heavily conductive state, a coupling capacitor and means for applying an input waveform to said input electrode through said capacitor to bias said transistor to a cut-off state which continues for an interval determined by a circuit time constant, the improvement consisting in the provision of the following features in combination:

a feedback path from said output electrode to said input electrode, said path including a diode connected to said output electrode and poled to limit bottoming of said transistor, said path including at least one further diode connected between said means for biasing said transistor and said input electrode, said at least one further diode being poled oppositely to the first said diode so that a quiescent current flows therethrough to maintain a potential difference between said input and output electrodes opposed to bottoming of the transistor, and a pair of yet further diodes connected between said input electrode and a reference potential and having said capacitor connected to their junction, said pair of diodes being poled to pass said quiescent current when said transistor is in its normally conductive state and as to pass to said input electrode only input waveform transitions of a sense to cut-off said transistor.

2. A transistor pulse generator comprising a transistor with base, emitter and collector electrodes, said emitter being grounded;

a load resistor connecting said collector electrode to a source of operating potential;

a base-feed resistor connected to the source of operating potential;

at least three diodes connected in series between said base-feed resistor and ground to form first and second junctions having one of said diodes therebetween, all of said diodes being poled so that a quiescent current flows between said source and ground when said transistor is in a conducting state, said first junction being connected to ground through one of said diodes, said second junction being connected to said base electrode;

an input coupling capacitor connected to said first junction for applying an input waveform thereto, the input waveform transitions of a sense to cut-off said transistor being passed to said base electrode to render said transistor non-conductive and reverse bias the diode connecting said first junction to ground so that the flow of quiescent current ceases;

a feedback diode connected between said collector electrode and the junction of said base-feed resistor and said at least three diodes with like electrodes of said feedback diode and said at least three diodes connected together; and an output terminal connected to said collector electrode.

References Cited by the Examiner

UNITED STATES PATENTS

| | | | |
|---|---|---|---|
| 3,093,776 | 6/1963 | Bird et al. | 307—88.5 |
| 3,105,914 | 10/1963 | Martin et al. | 307—88.5 |
| 3,134,033 | 5/1964 | Cepuch et al. | 307—88.5 |

OTHER REFERENCES

"Basic Theory and Application of Transistors," Dept. of Army Technical Manual, TM11690, March 1959, pages 198 and 199 and FIG. 193 relied on.

"Variable Input Single Shot," by Stahl, IBM Technical Disclosure Bulletin, vol. 2, No. 1, June 1959. Page 27 relied on.

ARTHUR GAUSS, *Primary Examiner.*

JOHN W. HUCKERT, *Examiner.*